(12) United States Patent  (10) Patent No.: US 7,829,430 B2
Pendharker et al.  (45) Date of Patent: Nov. 9, 2010

(54) METHODS FOR PREPARING AND DEVICES WITH TREATED DUMMY MOATS

(75) Inventors: Sameer Pendharker, Allen, TX (US); Binghua Hu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 365 days.

(21) Appl. No.: 11/968,085

(22) Filed: Dec. 31, 2007

(65) Prior Publication Data

US 2009/0166875 A1    Jul. 2, 2009

(51) Int. Cl.
*H01L 21/762* (2006.01)
*H01L 21/3213* (2006.01)

(52) U.S. Cl. .............. 438/424; 438/682; 438/692; 257/E21.546; 257/E21.304; 257/E21.593

(58) Field of Classification Search ............ 438/424, 438/682, 626, 630, 631, 645, 692; 257/E21.546, 257/E21.304, E21.593, E21.296
See application file for complete search history.

(56) References Cited

U.S. PATENT DOCUMENTS

| 6,805,614 | B2 * | 10/2004 | Kwok | 451/37 |
| 7,498,639 | B2 * | 3/2009 | Steinmann et al. | 257/370 |
| 7,531,415 | B2 * | 5/2009 | Kwok | 438/296 |
| 2005/0042880 | A1 * | 2/2005 | Kwok | 438/697 |
| 2006/0073672 | A1 * | 4/2006 | Steinmann et al. | 438/445 |

* cited by examiner

*Primary Examiner*—David Vu
*Assistant Examiner*—Earl N Taylor
(74) *Attorney, Agent, or Firm*—Warren L. Franz; Wade J. Brady, III; Frederick J. Telecky, Jr.

(57) ABSTRACT

Devices and methods are presented to fabricate dummy moats in an isolation region on a substrate. Presently, dummy moats are prone to losing impedance after the silicidation process. In high-voltage devices, silicided dummy moats reduce the breakdown voltage between active regions, particularly when the dummy moat overlaps or is in close proximity to a junction. The present devices and methods disclose a dummy moat covered with an oxide layer. During the silicidation process, the dummy moat and other designated isolation regions remain non-silicided. Thus, high and stable breakdown voltages are maintained.

16 Claims, 4 Drawing Sheets

METHODS FOR PREPARING AND DEVICES WITH TREATED DUMMY MOATS

BACKGROUND OF THE INVENTION

1. Field of the Invention

The present invention relates generally to semiconductor devices. More particularly, the present invention relates to forming an isolation structure in a substrate.

2. Background of the Invention

With increasing Large Scale Integration and smaller semiconductor device sizes, there is a greater risk of unwanted interferences between semiconductor components. Components must be properly isolated to prevent current leaks or voltage breakdowns between junctions. This is especially true for high-voltage components. Present methods for generating isolation regions are compromised by STI-CMP (shallow trench isolation chemical mechanical polishing) constraints. Conventional methods don't tend to generate relatively impermeable and stable isolation regions, especially for high-voltage applications.

In a substrate of single crystalline silicon, semiconductor devices are formed in what are known as active regions. These active regions need to be electrically isolated from each other. This can be done by removing portions of the substrate, thereby creating a trench or recessed layer between the semiconductor devices. A dielectric layer is introduced into the trench or recess to create the isolation region. Such a technique is commonly referred to as shallow trench isolation (STI).

On a more specific level, this known technique involves applying a blocking layer over the silicon substrate, selectively removing portions of the blocking layer and the substrate where an isolation region is needed, oxidizing, and then depositing the dielectric layer over the blocking layer and in the trench or recess. Then, a chemical-mechanical polishing (CMP) step is carried out on the dielectric layer in order to remove portions of the dielectric layer disposed above the blocking layer, while leaving a planarized portion of the dielectric layer in the trench or recess. A small portion of the blocking layer may be incidentally removed with the upper portion of the dielectric layer.

There may be variations in dependence on the size of respective active regions which are near each other, because the chemical-mechanical polishing process tends to remove material more rapidly over smaller active regions than over larger active regions. This can be cured by providing dummy moats or dummy active regions, which are similar to true active regions except that no components are ultimately fabricated in these dummy regions. The purpose of these dummy active regions is to increase the cumulative area of active regions present in certain portions of the wafer.

However, there are several problems with dummy moat generation as practiced today. Dummy moats are generated using a set of rules. These rules determine the moat area and placement, and these moats are patterned before and during the STI-CMP process. When the diffused layers are subsequently silicided, the dummy moat is also silicided. Thus, a dummy diffused layer will have a silicide layer on top of the remaining non-alloyed part. Where in CMOS applications, the diffusions are small so the dummy moat area need not be large, this is not a problem. However, in higher-voltage applications, diffusions are large so inevitably, a larger junction area is covered. Since the dummy moat is typically silicided, when a dummy moat resides across a junction region, the threshold breakdown voltage across the junction is lowered, leading to shorts across the junction.

Also, suicide dummy moats located near or across junctions could short the junctions. Therefore, dummy moats have to be kept out as far as 12 μm for high voltage devices, leading to further STI-CMP process issues.

Conventional efforts to curb this problem have focused on excluding any dummy generation around the junction areas. These exclusion zones result in a reduction in the overall moat density. This causes problems with the STI-CMP process as described above because a larger moat area gives more uniform CMP results. Also, exclusion zones for high-voltage devices must be larger, which raises issues with dummy moat density rules. What is needed is an improved method to generate dummy moats without reducing the moat size/density while maintaining a high breakdown voltage.

SUMMARY OF THE INVENTION

The present invention discloses a method for generating sufficient dummy moats in a high voltage chip without compromising the junction breakdown voltage. This is achieved by introducing a dummy silicide block layer mask (Block Layer) over selected dummy moat regions. The block layer ensures that certain dummy moat regions remain non-silicided, thus eliminating any potential breakdown pathways across the dummy moat. In effect, this allows for generation of dummy moats across or close to junction regions without compromising the junction.

In one exemplary embodiment, the present invention is a method for generating a non-silicided dummy moat in a high voltage chip. A block layer is generated on top of an existing dummy moat, thereby making it less prone to causing voltage breakdowns. This allows for greater discretion in the placement and etching of the dummy moat.

In another exemplary embodiment, the present invention is an automated coding mechanism to generate sufficient dummy moats in a high voltage chip. A standard set of rules is used to generate the dummy moats. Then, an enhanced set of rules generates a block layer across selected dummy moats.

In another exemplary embodiment, the present invention is a semiconductor device comprising isolation regions, dummy moats fabricated in the isolation regions, and a block layer coating the dummy moats. The area of the block layer may exceed the area of the dummy moat, and is determined by an algorithm that detects the size and position of the dummy moats with respect to junctions on the semiconductor device.

In another exemplary embodiment, the block layer is essentially an oxide layer that coats the surface of the substrate including all active regions. During the silicidation process, an algorithm creates windows within which silicidation does not occur. These windows are typically positioned over dummy moats in close proximity to junction regions.

DETAILED DESCRIPTION OF THE INVENTION

Figure 1:
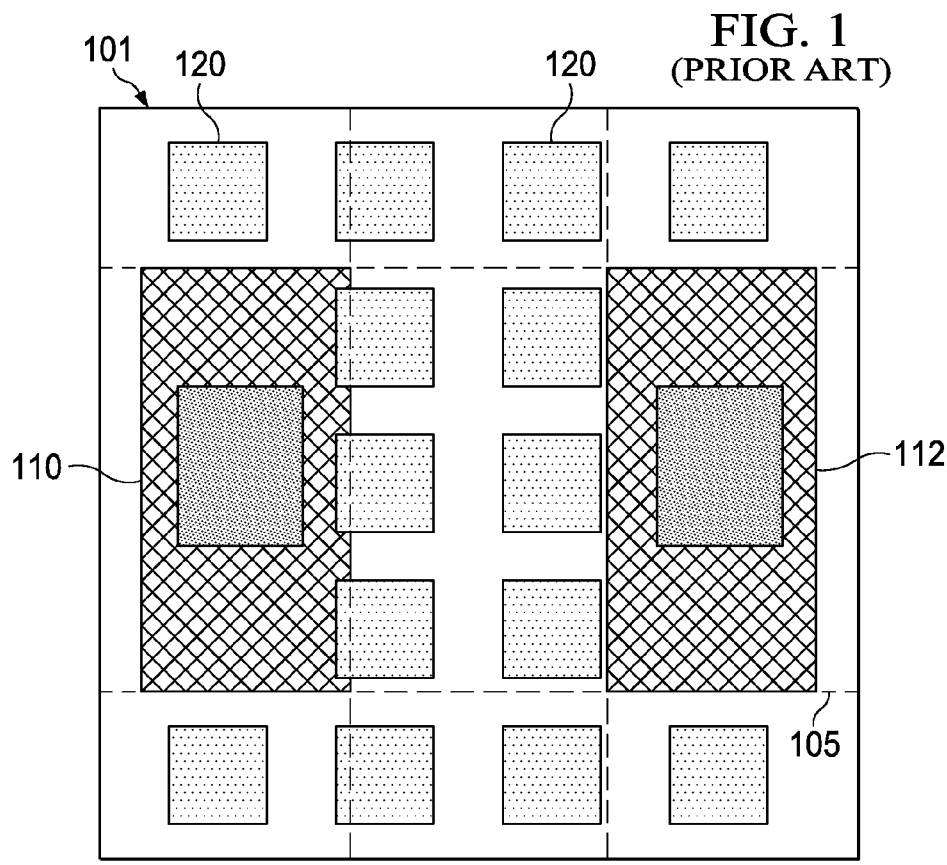
FIG. 1 shows a conventional silicided dummy moat present across a junction region.

The present invention discloses a non-silicided dummy moat. A semiconductor device is prepared using conventional techniques, comprising a substrate, active regions on the substrate, and isolation regions. This process also includes formation of dummy moats in the inactive or isolation regions of the substrate for CMP efficacy and to meet design rules. The active regions may be doped or may contain semiconductor devices such as transistors, and are isolated from each other by STI formation of trenches. According to one embodiment of the present invention, part of the surface of the wafer is coated with a dummy Silicide Blocking Layer (Block Layer). Based on the design rules for the dummy moats, an algorithm is invoked which detects dummy moats, and determines which regions are to remain non-silicided. The block layer is then etched away from the active regions allowing them to be silicided. The designated regions covered by the block layer are not silicided. Thus dummy moats lying within these regions do not affect leakages, noise, or voltage breakdowns between active regions, even in high-voltage configurations.

For the purposes of this disclosure, the term "substrate" or "wafer" includes any thin slice of semiconducting material, such as a silicon crystal, upon which microcircuits are constructed by doping, chemical etching, and deposition. Substrates may undergo Shallow Trench Isolation (STI), Chemical-Mechanical Planarization (CMP), lithography, ion implantation, and other processes. Substrates include "active regions" and "isolation regions."

An "active region" is an area of the substrate upon which transistors are built or will be built. Active regions need to be electrically isolated from each other to ensure proper function of the device. "Isolation Region" may be any region that is not an active region. Isolation regions are generally placed between multiple active regions, so as to electrically isolate the active regions from each other. Shallow Trench Isolation (STI) is a conventional isolation method involving the selective removal of portions of the substrate in order to define a trench or recess where an isolation region is needed. A dielectric layer is then introduced into the trench or recess.

A "dummy moat" is a designated area that is similar to an active region except that no components are fabricated in the dummy region. Dummy moats, like active regions, are made of semiconducting material that is formed within an isolation region or an STI region. The purpose of these dummy regions is to increase the cumulative area of active regions present in certain portions of the substrate. This facilitates the CMP process by providing the mechanical brush involved in CMP with a uniform depth and resistance, especially when there are large isolation regions present between active regions. Thus, it is equally crucial that the total density of the dummy moat be set to a certain level for uniform polishing to occur.

Silicidation or salicidation (Self-Aligned Silicide) involves the deposition of a thin transition metal layer over fully formed and patterned semiconductor devices or wafers. This forms a low-resistance transition metal silicide in the active regions (including dummy moats) present on the substrate. The isolation regions that have been insulated with an oxide remain silicide-free. As mentioned herein, a silicided dummy moat may lead to significantly lowered breakdown voltages, especially across junctions in high-voltage situations.

FIG. 1 shows a fully formed and patterned conventional substrate as it exists in the art. Substrate 101 contains junctions 105, indicated in the figure by the dashed lines. Two active regions 110 and 112 have been designated on substrate 101. Active regions 110 and 112 may contain transistors or other semiconductor components, including CMOS and high-voltage components. Additionally, multiple "dummy moats" 120 have also been incorporated. The size and placement of dummy moats 120 may be determined by an algorithm based on the distance between active regions and the overall density of the dummy regions. Dummy moats 120 may not all be the same size.

In FIG. 1, multiple dummy moats lie across junction lines 105. This includes dummy moats lying across depletion regions that may be in contact with the active regions. Since the silicidation process decreases the impedance of the dummy moats, the dummy moats lying near and across active regions and junctions cause fluctuations in threshold voltage, potentially resulting in breakdowns. In the present case, active region 110 has three dummy moats overlapping the junction to its right. Active region 112 has three dummy moats lying adjacent to the junction on its left.

Figure 2:
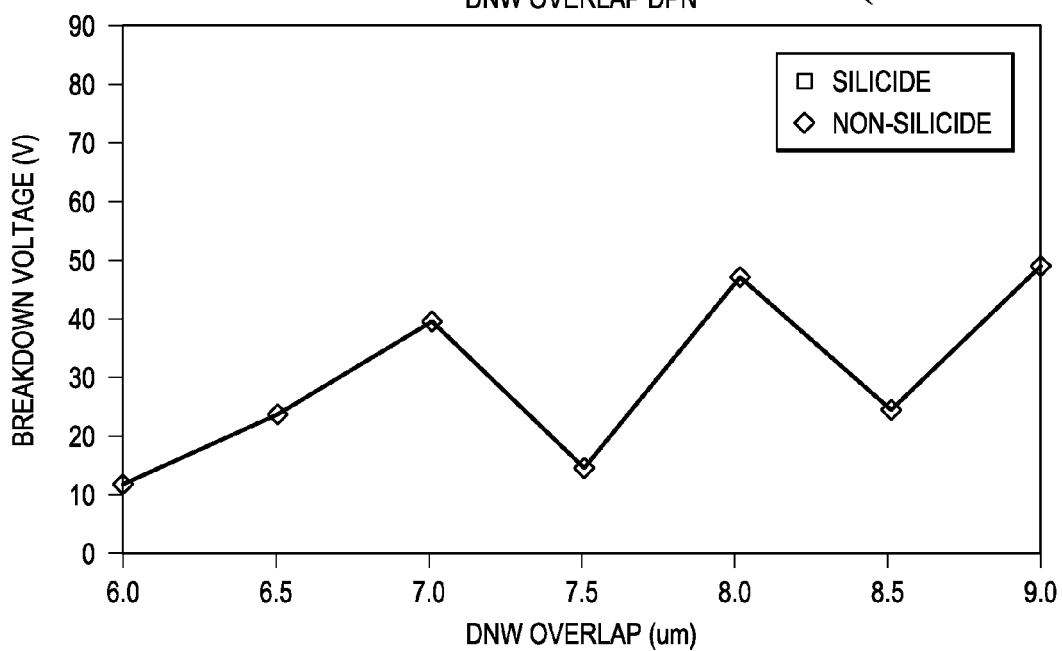
FIG. 2 shows the corresponding effect on breakdown voltage across a junction of a silicided dummy moat, according to the prior art.

FIG. 2 shows the effect of these dummy moats in close proximity to the junction regions. This graph is based on data that indicates that with a small dummy moat overlapping a deep N-well (DNWELL) diode, the DNWELL to EPI (epitaxial) breakdown voltage is lower than the normal of around 90 volts. It was noted that an overlap similar to that of active region 110 results in a significantly lower voltage: around 15 volts, while a dummy moat lying adjacent to a region like active region 112 resulted in a higher breakdown voltage of around 50 volts.

The present invention solves these fluctuations by applying a dummy Silicide Block Layer to the dummy moat. The block layer may be a layer of an oxide that coats the surface of a fully formed and patterned wafer. A block layer can be patterned into any desired shape; thus it is not necessary that the entire surface of the wafer be coated. According to one exemplary embodiment of the present invention, an algorithm is invoked to detect the presence of dummy moats, and to apply the block layer only to the dummy regions. This prevents the dummy regions from becoming silicided. The result is a higher-impedance dummy moat and subsequently higher and more stable breakdown voltage thresholds. In another exemplary embodiment, the entire surface of the wafer is coated with a block layer, and an algorithm is invoked to dissolve only specific regions of the wafer, namely the active regions, leaving other regions including STI regions and dummy moats non-silicided.

Figure 3:
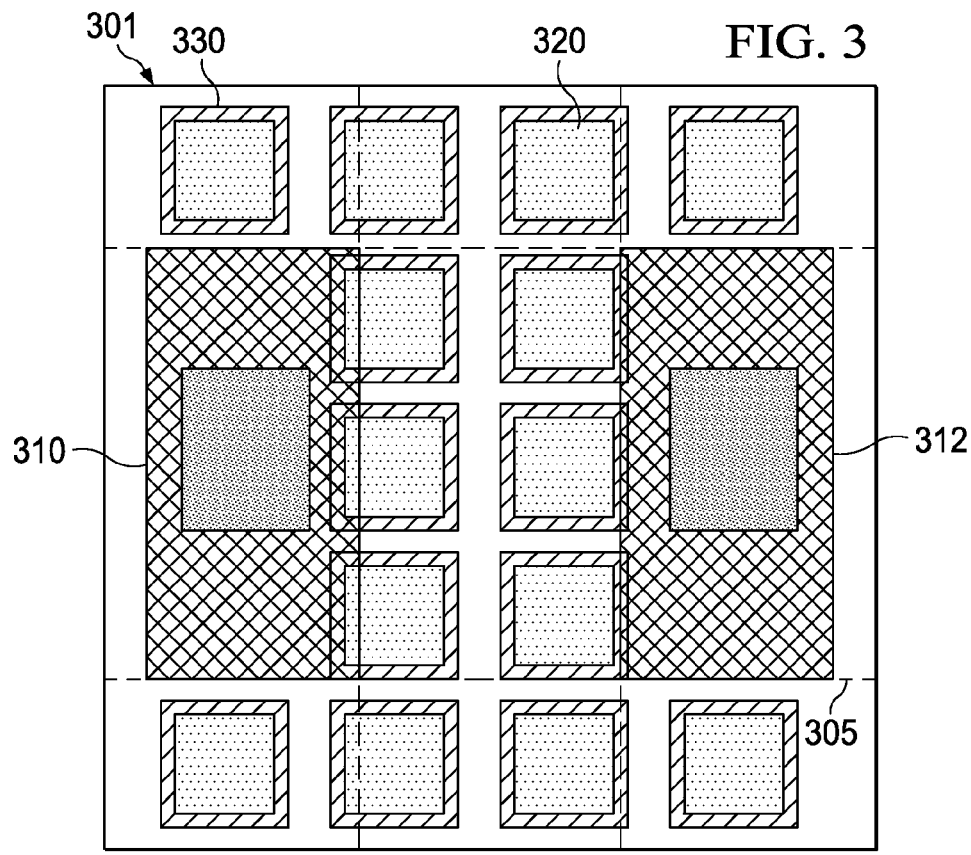
FIG. 3 shows dummy moats having a block layer, according to an exemplary embodiment of the present invention.

FIG. 3 shows a fully formed and patterned substrate according to an exemplary embodiment of the present invention. Substrate 301 is patterned similar to Substrate 101. Junctions 305 are represented by dashed lines. Active regions 310 and 312 may contain semiconductor components having varying potentials. Dummy moats 320 are present. Some dummy moats 320 overlap the junction to the right of active region 310, while others lie adjacent to the junction to the left of active region 312.

However, as is apparent from the figure, dummy moats 320 have been coated with a dummy Silicide Block Layer (block layer) 330. Block layer 330 may be an oxide layer that is applied to dummy moats 320 before the silicidation process. Alternatively, block layer 330 may be the remnants of an oxide layer that covered the entire surface 301, before the silicidation process invoked the algorithm to silicide active regions while leaving dummy moats non-silicided. In either case, the result is that silicided dummy moats 312 have higher impedance values, and are therefore less prone to causing shorts/breakdowns across junctions. This results in higher and more stable breakdown voltage thresholds, thus greater benefits in high-voltage applications.

Figure 4:
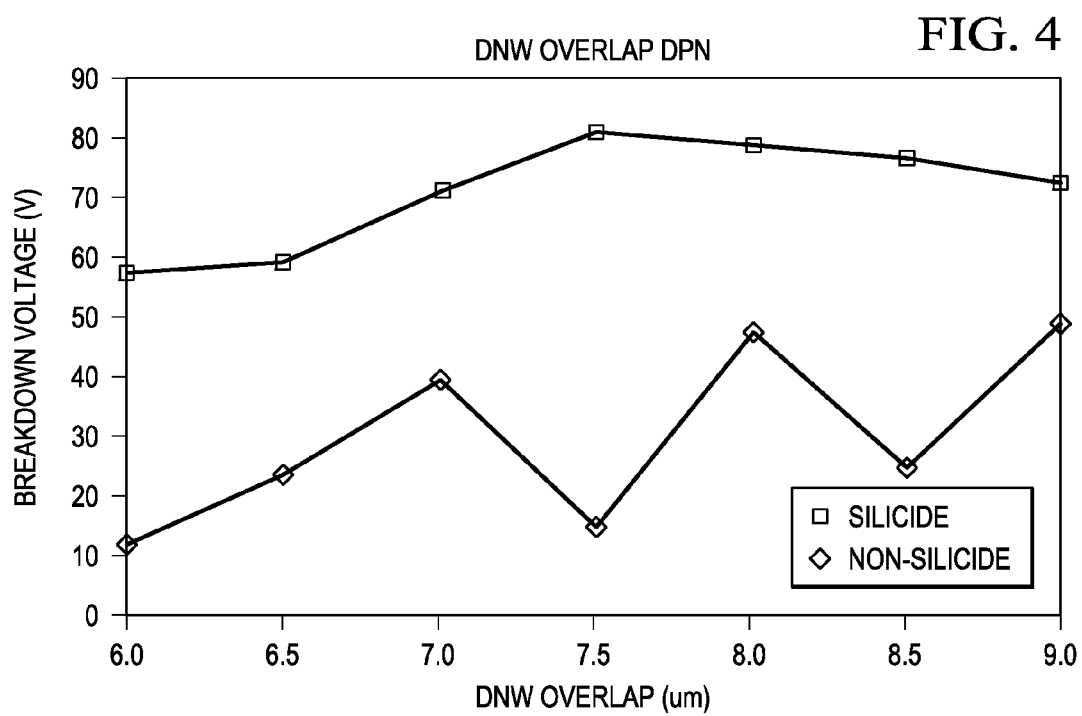
FIG. 4 shows a comparison of breakdown voltage between the prior art and a non-silicided dummy moat, according to an exemplary embodiment of the present invention.

FIG. 4 shows the results of an experimental comparison between silicided and non-silicided dummy moats. This graph is based on data that confirms that a silicided dummy moat is a cause of random breakdown voltage fluctuations. Substrates 101 and 301 have the same configurations with the only difference being that the dummy moats 320 were covered with a block layer, thus remained non-salicided. As the graph shows, this results in higher and more stable breakdown voltages, approaching the ideal threshold of 90 volts, which is typical for high-voltage applications. Even varying overlap ranges of dummy moats over junctions does not vary the breakdown voltage significantly. Additionally, experimental results show that on wafers without silicide, no junction shorts or leakages were found on DNW/EPI diodes that were coated with a block layer.

Different algorithms may be used to determine dummy moat size. Multiple sizes of dummy moats may exist to fit in with active regions so long as a dummy moat density rule is satisfied. Thus, an exemplary embodiment of the present invention includes an algorithm to detect dummy moats of varying sizes, and calculating the overall size of the block layer. The logic first determines from the design how the dummy moats are to be generated. This algorithm recognizes dummy moats, and deposits a block layer over the dummy moats. This prevents the moat from becoming silicided. Even if a dummy moat sits across a junction, there will be no short across the junction. Thus the threshold breakdown voltage remains stable while moat density remains unaffected.

Figure 5:
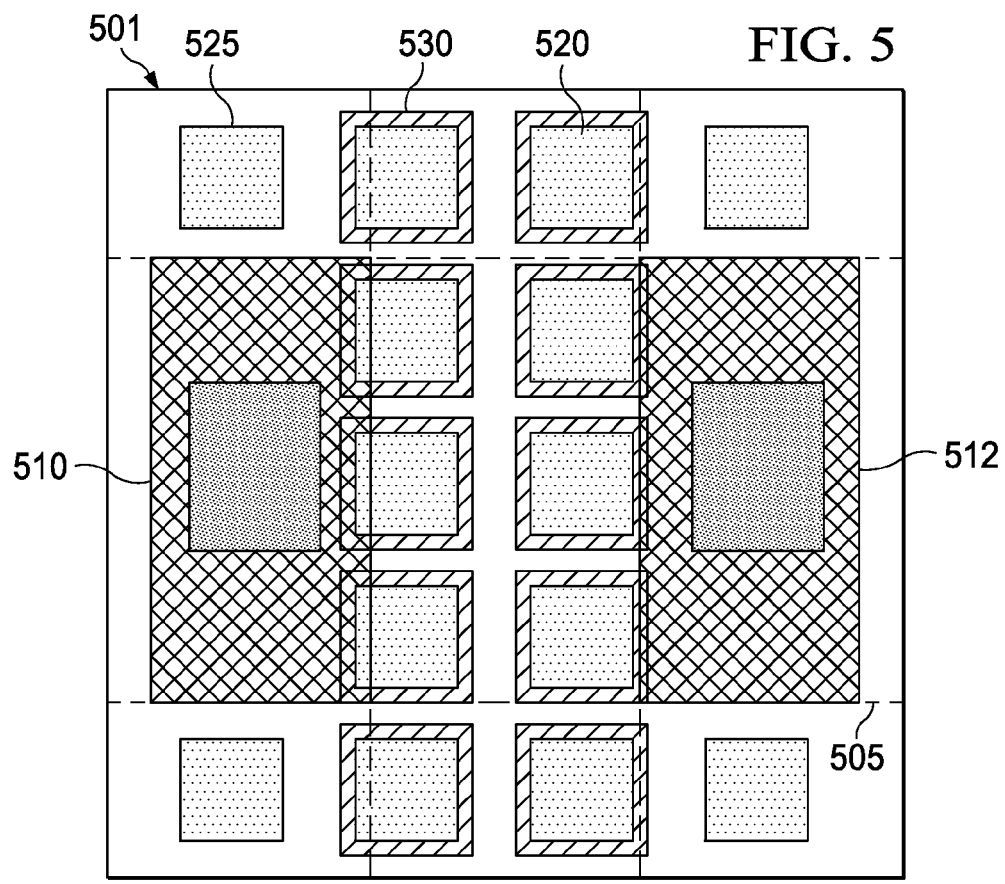
FIG. 5 shows selected dummy moats having a block layer, according to an exemplary embodiment of the present invention.

Additionally, block layer may extend or overlap beyond the area of the dummy moat to allow for potential misalignment. The functionality also comprises the ability to determine the proximity of a dummy moat to an active junction, and to selectively apply block layer to those dummy moats. FIG. 5 shows the effect of such scenario, according to an exemplary embodiment of the present invention. Substrate 501 is patterned similar to Substrates 101 and 301. Junctions 505 are represented by dashed lines. Active regions 510 and 512 may contain semiconductor components having varying potentials. Dummy moats 520 are present. Some dummy moats 520 overlap one or more junctions, including junctions with active components 510-512.

However, unlike FIG. 3, dummy moats 520 have not all been coated with a dummy Silicide Block Layer (block layer) 530. It is apparent from the figure that only dummy moats close to junction regions 505 have been coated with a block layer. Dummy moats 525 remain at a safe distance from any junctions 505, active regions 510 and 512, or depletion regions. Thus, they can be salicided. As previously noted, the block layer 530 may be an oxide layer that is applied to dummy moats 520 before the silicidation process, or it may be the remnants of an oxide layer that covered the entire surface 501, before the silicidation process invoked the algorithm to silicide active regions while leaving dummy moats unsilicided.

Figure 6:
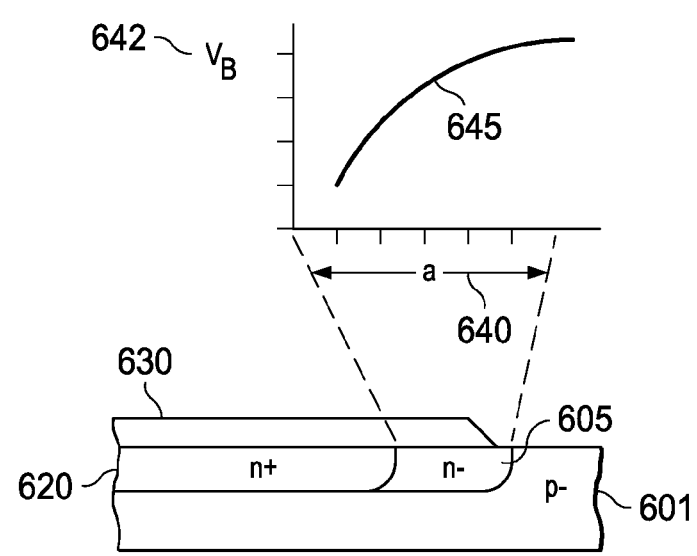
FIG. 6 shows proximity to a junction may be programmed in an algorithm that creates a template or mask for the block layer, according to an exemplary embodiment of the present invention.

The ability to determine proximity to a junction may be programmed in the algorithm that creates the template or mask for the block layer. FIG. 6 shows a close-up view of how this might work. In this exemplary embodiment, a "p-" substrate 601 is patterned with an n-well 605 and an n+dummy moat 620. Block layer 630 overlaps the junction, depending on an amount decided by the algorithm. The algorithm aims to determine the amount of overlap a 640 that is needed to stabilize this junction. At low a, the breakdown voltage 642 is low, so the algorithm increases the preset overlap distance. Since the breakdown voltage is a function of the overlap distance a, at some point the breakdown voltage tapers to a steady level 645. Thus, the algorithm determines the increase in area of block layer 630 to a point where the junction will be stable.

Apart from this functionality, the algorithm to generate the silicide block is also able to determine, based on the distance between dummy moats, how much overlap to apply to one or more adjacent dummy moats. Based on a silicide-to-silicide rule, the algorithm can merge the geometries in a way that all the moats are covered.

Figure 7:
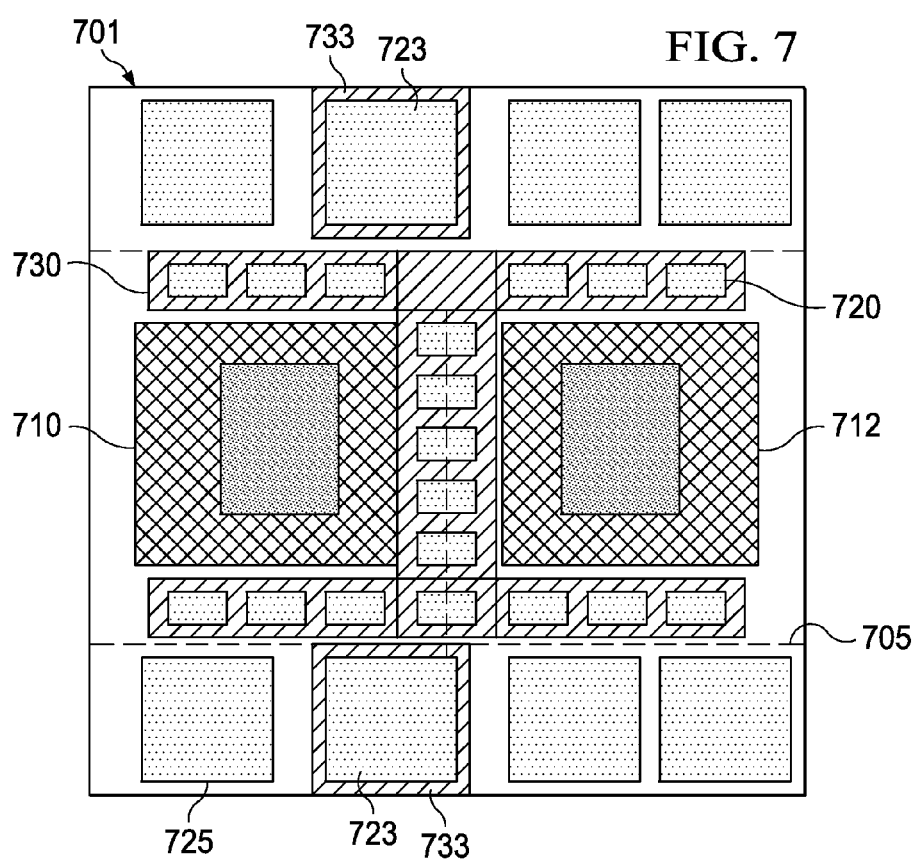
FIG. 7 shows selected dummy moats having a block layer, according to an exemplary embodiment of the present invention.

FIG. 7 demonstrates this functionality according to an exemplary embodiment of the present invention. Substrate 701 is patterned to include Junctions 705 represented by dashed lines, active regions 710 and 712, and dummy moats 720, 723, and 725. Active regions 710 and 712 may contain semiconductor components having varying potentials. Dummy moats 720 overlap one or more junctions 705, as well as junctions adjacent to active regions 710 and 712. Similarly, dummy moats 723 overlap or are adjacent to one or more junctions 705. Finally, dummy moats 725 are not close enough to any junctions, active regions, or depletion zones.

Dummy moats 725 remain non-silicided because of their lack of proximity to a junction. Dummy moats 723, similar to the previous exemplary embodiments, lie adjacent or overlap junctions 705, and are thus coated with a block layer. However, dummy regions 720 are not only close to or overlapping junctions and active regions, but are also close to each other. In this exemplary embodiment, the block layer generation algorithm has determined that a single layer of block layer is the most effective way to block silicide formation on dummy moats 720. This determination may be made as a function of the distance between dummy moats, as well as the proximity to junctions. The result is a series of uniform non-silicided dummy moats that can freely overlap junctions without any danger of shorting across junctions or lowering the threshold breakdown voltage.

As previously noted, the block layer 730 and 733 may be an oxide layer that is applied to dummy moats 720 and 723, respectively, before the silicidation process, or may be the remnants of an oxide layer that covered the entire surface 701, before the silicidation process invoked the algorithm to silicide active regions while leaving dummy moats non-silicided. Other variations are also possible and within the scope of the present invention.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for fabricating a semiconductor device, comprising:
   forming shallow trench isolation structures to define electrically isolated active regions and dummy moats on a substrate; including:
   selectively removing portions of the substrate to form trenches;
   forming a layer of insulating material over the substrate including in the trenches; and
   removing portions of the insulating material outside of the trenches;
   forming a layer of silicide-blocking material to selectively cover at least some portions of at least some of the dummy moats, leaving at least some portions of at least some of the active regions uncovered;
   forming a layer of siliciding material at least over the covered portions of the dummy moats and over the uncovered portions of the active regions;
   reacting the layer of siliciding material with the uncovered portions of the active regions, with the layer of silicide-blocking material serving to prevent reaction with the covered portions of the dummy moats; and
   removing unreacted portions of the layer of siliciding material.

2. The method of claim 1, wherein the silicide-blocking material is an oxide.

3. The method of claim 1, wherein forming the layer of silicide-blocking material includes forming a blanket layer of silicide-blocking material over the dummy moats and the active regions; and selectively removing portions of the layer of silicide-blocking material to define the uncovered portions of the active regions.

4. The method of claim 3, wherein the blanket layer of silicide-blocking material is formed before or together with forming the shallow trench isolation structures.

5. The method of claim 1, wherein the layer of silicide-blocking material leaves at least some other dummy moats uncovered.

6. The method of claim 1, wherein selection of the at least some portions of the at least some of the dummy moats that are covered is a function of proximity to a semiconductor junction or to an active region.

7. The method of claim 1, wherein the layer of silicide-blocking material is formed to cover one or more dummy moats with an area or areas of silicide-blocking material that is greater than an area or areas of the one or more dummy moats.

8. The method of claim 7, wherein difference between the area or areas of the silicide-blocking material and the area or areas of the one or more dummy moats is a function of proximity to a semiconductor junction or an active region.

9. A method for fabricating a semiconductor device, comprising:
   forming shallow trench isolation structures to define electrically isolated active regions and dummy moats on a substrate; including:
   selectively removing portions of the substrate to form trenches;
   forming a layer of insulating material over the substrate including in the trenches; and
   performing chemical-mechanical planarization to remove portions of the insulating material outside of the trenches;
   forming a layer of silicide-blocking material to selectively cover at least some of the dummy moats, leaving at least some of the active regions uncovered;
   forming a layer of siliciding material over the covered dummy moats and over the uncovered active regions;
   reacting the layer of siliciding material with the uncovered active regions, with the layer of silicide-blocking material serving to prevent reaction with the covered dummy moats; and
   performing chemical-mechanical planarization to remove unreacted portions of the layer of siliciding material.

10. The method of claim 9, wherein the silicide-blocking material is an oxide.

11. The method of claim 10, wherein forming the layer of oxide includes forming a blanket layer of oxide over the dummy moats and the active regions; and selectively removing portions of the layer of oxide to define the uncovered active regions.

12. The method of claim 11, wherein the blanket layer of oxide is formed before or together with forming the shallow trench isolation structures.

13. The method of claim 9, wherein the layer of silicide-blocking material leaves other dummy moats uncovered.

14. The method of claim 13, wherein selection of the dummy moats that are covered and the dummy moats that are uncovered is a function of proximity to a semiconductor junction or to an active region.

15. The method of claim 9, wherein the layer of silicide-blocking material is formed on the covered dummy moats with areas of silicide-blocking material that are greater than areas of the covered dummy moats.

16. The method of claim 15, wherein difference between the areas of the silicide-blocking material and the areas of the covered dummy moats is a function of proximity to a semiconductor junction or an active region.

* * * * *